United States Patent [19]
Dixon et al.

[11] Patent Number: 5,465,897
[45] Date of Patent: Nov. 14, 1995

[54] BONDED ULTRASONIC TRANSDUCER AND METHOD FOR MAKING

[75] Inventors: Raymond D. Dixon; Lawrence H. Roe, both of Los Alamos; Albert Migliori, Santa Fe, all of N.M.

[73] Assignee: The Regents of the University of California, Office of Technology Transfer, Alameda, Calif.

[21] Appl. No.: 220,306

[22] Filed: Mar. 29, 1994

[51] Int. Cl.⁶ .......................... B23K 1/19; B23K 101/36
[52] U.S. Cl. ........................... 228/121; 228/124.5
[58] Field of Search .................. 228/121, 122.1, 228/124.5, 193, 208; 310/327, 364

[56] References Cited

U.S. PATENT DOCUMENTS

| | | | |
|---|---|---|---|
| 2,709,147 | 5/1955 | Ziegler | 228/121 |
| 4,051,582 | 10/1977 | Eschler et al. | 29/25 |
| 4,247,034 | 1/1981 | Burkart et al. | 228/116 |
| 4,270,691 | 6/1981 | Ishii et al. | 228/194 |
| 4,582,240 | 4/1986 | Lux et al. | 228/121 |
| 4,848,643 | 7/1989 | Frische et al. | 228/121 |
| 4,895,290 | 1/1990 | Dunnrowicz et al. | 228/116 |
| 5,131,582 | 7/1992 | Kaplan et al. | 228/121 |
| 5,288,351 | 2/1994 | Hoang et al. | 228/121 |
| 5,325,012 | 6/1994 | Sato et al. | 228/122.5 |

FOREIGN PATENT DOCUMENTS 157679 12/1982 Germany .................. 228/121

*Primary Examiner*—Samuel M. Heinrich
*Attorney, Agent, or Firm*—Ray G. Wilson

[57] ABSTRACT

An ultrasonic transducer is formed as a diffusion bonded assembly of piezoelectric crystal, backing material, and, optionally, a ceramic wear surface. The mating surfaces of each component are silver films that are diffusion bonded together under the application of pressure and heat. Each mating surface may also be coated with a reactive metal, such as hafnium, to increase the adhesion of the silver films to the component surfaces. Only thin silver films are deposited, e.g., a thickness of about 0.00635 mm, to form a substantially non-compliant bond between surfaces. The resulting transducer assembly is substantially free of self-resonances over normal operating ranges for taking resonant ultrasound measurements.

4 Claims, 4 Drawing Sheets

# BONDED ULTRASONIC TRANSDUCER AND METHOD FOR MAKING

This invention was made with government support under Contract No. W-7405-ENG-36 awarded by the U.S. Department of Energy. The government certain rights in the invention.

BACKGROUND OF THE INVENTION

This invention relates to ultrasonic transducers and, more particularly, to ultrasonic transducers for the detection of vibrational resonances of an object.

Conventional ultrasonic transducers may be used to obtain the resonant frequency spectrum of a component in response to the excitation of the component by ultrasonic sound waves, i.e., sound waves having frequencies generally above about 20 kHz. Such transducers may be "bare" transducers, i.e., bare piezoelectric crystals with electrical leads attached, or commercial transducer assemblies with component parts that are adhesively bonded together.

A problem with conventional transducers is that the measured response spectrum is composed of resonances from both the object being tested and the transducer. As illustrated in FIGS. 3A–3C, even simple bare transducers have natural resonances and harmonics that start at low frequencies and extend up to several megahertz. A system with either a noisy driver (exciter) or detector or both will have peaks in the resonant ultrasound spectrum (RUS) that originate from the noise source. The analysis of the RUS must account for these noise peaks. However, it is not possible to define the position of these noise peaks a priori because any object used for the calibration will itself have resonances that will be in the spectrum. Transducers formed from adhesively bonded components will have additional resonance peaks arising from the compliance of the adhesive bonding.

It would be desirable to provide an ultrasonic transducer that does not introduce self-resonances into the RUS from an object being analyzed. Accordingly, it is an object of the present invention to provide a bonded ultrasonic transducer with highly reproducible properties and without self-resonant responses in a RUS range of interest.

It is another object of the present invention to make robust transducers for use in non-destructive testing applications to output response signals that accurately represent the resonant response of an object.

Yet another object of the present invention is to provide a method for fabricating ultrasonic transducers that have a broadband linear response.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein, the product of this invention may comprise a linearly responsive ultrasonic transducer. A piezoelectric crystal defines a first surface and a first silver film is disposed over the first surface to a deposited thickness greater than about 0.005 mm and less than about 0.012 mm. A backing layer of a ceramic material defines a second surface and a second silver film is disposed over the second surface to a deposited thickness greater than about 0.005 mm and less than about 0.012 mm. The first and second silver films are diffusion bonded together to form a substantially non-compliant bond between the piezoelectric crystal and the ceramic material.

In another embodiment of the present invention, a linearly responsive ultrasonic transducer is formed by coating at least one surface of a piezoelectric crystal with a first film of silver to a thickness between about 0.005 mm and 0.012 mm, coating at least one surface of a ceramic backing material with a second film of silver to a thickness between about 0.005 mm and 0.012 mm, and diffusion bonding together the first and second films of silver.

In particular embodiments of the invention, a wear surface may be configured from a selected material and one surface of the wear surface coated with a third film of silver to a thickness between about 0.005 mm and 0.012 mm. A second surface of the piezoelectric crystal is then coated with a fourth film of silver to a thickness between about 0.005 mm and 0.012 mm and the third and fourth films of silver are diffusion bonded together to form a substantially non-compliant bond between the piezoelectric crystal and the wear surface.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings.

DETAILED DESCRIPTION OF THE DRAWINGS

Figures 1A, 1B:
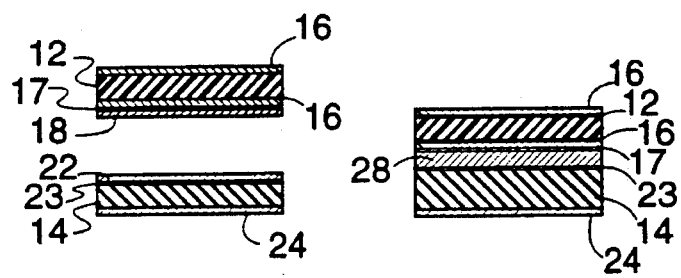
FIGS. 1A and 1B illustrate in cross-section the formation of a linearly responsive ultrasonic transducer according to the present invention.
Figures 2A, 2B, 2C, 2D, 2E:
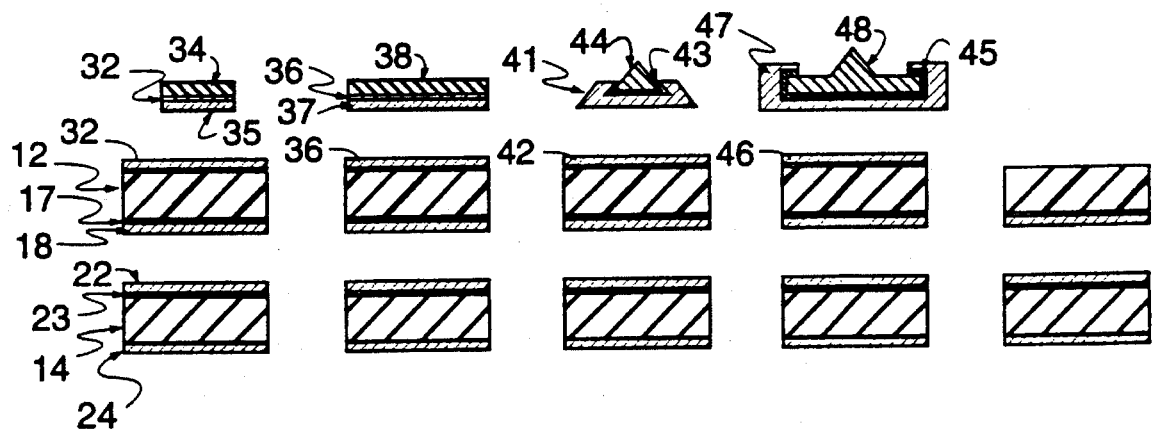
FIGS. 2A–2E illustrate in cross-section various embodiments of a linearly responsive ultrasonic transducer according to the present invention.

Referring first to FIGS. 1A and 1B, there is shown the fabrication of one embodiment of a linearly responsive ultrasonic transducer according to the present invention. As illustrated, a commercial piezoelectric crystal 12, which may be lead zirconium titanate (PZT), lithium niobate, or the like, is provided with gold-backed or Cr/Au surfaces 16. It will be understood that gold surfaces 16 neither add nor detract from the present invention and do not form a part of the present invention. In some embodiments a gold surface may serve as a wear surface for contacting a workpiece or as a conductive surface for attaching electrical leads (not shown). In a preferred embodiment, a metallic bonding film 17, e.g., hafnium (Hf) is deposited onto one surface of crystal 12 to a thickness of 100–300 Å. A silver film 18 is coated onto bonding film 17 to a thickness between about 0.005 mm and 0.012 mm. A backing layer 14, which may be alumina ($Al_2O_3$), silicon carbide, diamond, or the like, is provided with a high sound velocity to increase the transducer resonant frequency beyond the expected resonant response of the workpiece. Backing layer 14 is also preferably coated with a bonding film 23 on at least one surface. Silver film 22 is then deposited onto bonding film 23. As shown, conductive surface 24, which may be silver, gold, copper, or the like, provides for completing electrical contact with the completed transducer assembly.

It will be understood herein that a bonding film, e.g., films 17 and 23, are not required for an operable device. However, bonding films of a reactive metal such as Hf increase the adhesion between silver films and the underlying base material. Hence, such bonding films are preferable and are depicted in the embodiments described below. Both the bonding films and silver films are formed in a conventional vapor deposition process with the crystal substrate temperature of about 200° C. and a ceramic substrate temperature of about 300° C.

FIG. 1B depicts a bonded transducer assembly. The assembly includes piezoelectric crystal 12, backing layer 14, gold surfaces 16, bonding films 17 and 23, and conductive surface 24. Silver layers 18 and 22 have formed a single layer 28 through solid state metal diffusion bonding. The solid state metal diffusion bonding process is readily accomplished in air using any suitable heated press system. In the laboratory, the bonding process was done using an Instron tensile testing system with heated platens. The component parts shown in FIG. 1A were placed together in the press and heated to 200°–250° C. with a load applied for about 10–15 minutes. Higher temperatures might be used, if desired, provided that the temperature does not exceed the Curie temperature of the crystal. The applied load must be less than the ultimate tensile strength (UTS) of the weakest material, e.g., between 20 and 31 ksi for alumina. The resulting diffusion bonded structure is shown in FIG. 1B.

The solid state metal diffusion bonding between silver layers 18 and 22 forms a substantially non-compliant bonded layer 28. By non-compliant is meant that the bonded structure does not have any significant resonant response over the expected operating range of the transducer. Thus, only thin silver layers are deposited, i.e., less than about 0.012 mm, for use in forming the bonded layer 28. The increasing compliance associated with thicker silver layers will introduce additional resonances in the structure that nullify the affect of the solid state bond. It will be understood that excessively thin layers, i.e., layers less that about 0.005 mm, will not form an adequate bond under a solid state metal diffusion bonding process. It is preferred to have as thin a coating of silver as practicable and a coating thickness of about 0.00635 mm (0.00025 inches) was formed for use in obtaining the exemplary results herein.

FIGS. 2A–2E are cross-sections of various embodiments of the present invention, in exploded views to illustrate the unbonded component layers, where component layers have the same numerical representation as shown in FIGS. 1A and 1B. Surface 16 of FIGS. 1A and 1B may be gold or a conductive alloy of Au/Cu as typically received from a piezoelectric crystal supplier. These materials are relatively soft and any substantial use will wear and indent the surface. Such wear and indentations result in a surface that does not define a good point of contact between the transducer surface and the workpiece, with concomitant deterioration and distortion of the input signal and detected resonances. Accordingly, wear surfaces such as alumina are typically applied to the piezoelectric crystal to provide a stable surface for contacting the workpiece.

FIGS. 2A–2D illustrate various wear surface designs 34, 38, 44, and 48 that include a ceramic material having a high speed of sound and either a planar or peaked surface for contacting the workpiece. In all cases, silver is deposited over at least one surface as an overlying layer of silver for the corresponding silver layers 35, 37, 41, and 47, to match with silver layers 32, 36, 42, and 46, respectively, on piezoelectric crystals 12. Again, a bonding film is preferred to increase adhesion of the silver film with the underlying ceramic surface. Bonding films 32, 36, 43, and 45 are deposited on the underlying substrate. The selected wear surface is placed in the heated press, described above, with the silver coated piezoelectric crystal and the silver coated backing ceramic. The wear surface is then bonded to the piezoelectric crystal 12 by solid state metal diffusion, as discussed above, so that the resulting structure has substantially non-compliant layers connecting the component parts. The resulting structure does not exhibit resonances from the component parts that might interfere with resonances from the workpiece, but provides a relatively linear response over the general range for detecting workpiece resonant responses. FIG. 2E is an exploded view of a transducer formed in accordance with the present invention without a wear surface to demonstrate the linear response of the bonded structure formed herein.

Figure 3A:
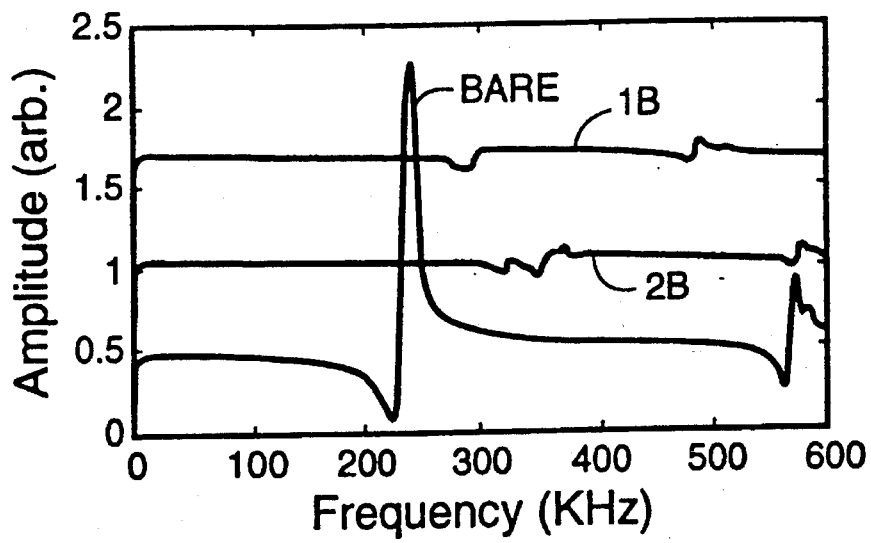
FIGS. 3A–3C graphically depict the response of two linearly responsive ultrasonic transducers fabricated according to the present invention and, for comparison, the response of a bare piezoelectric crystal transducer.
Figure 3B:
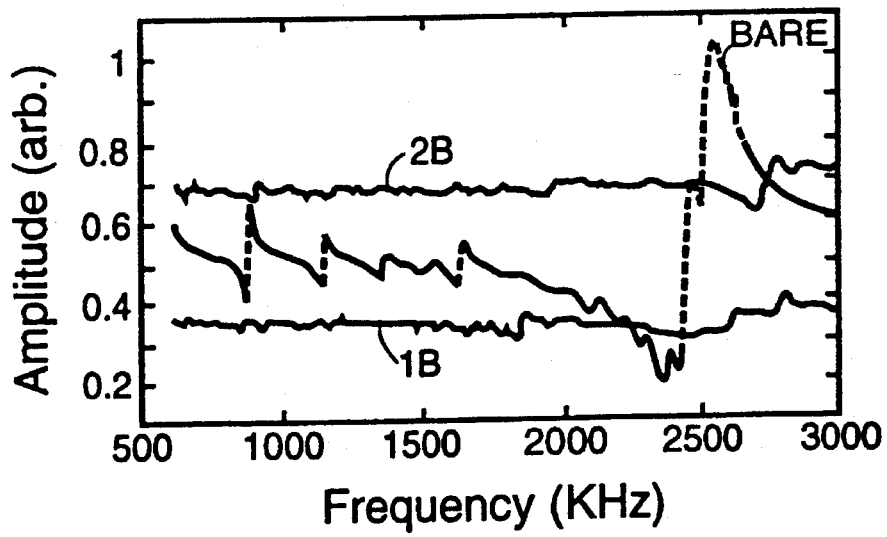
Figure 3C:
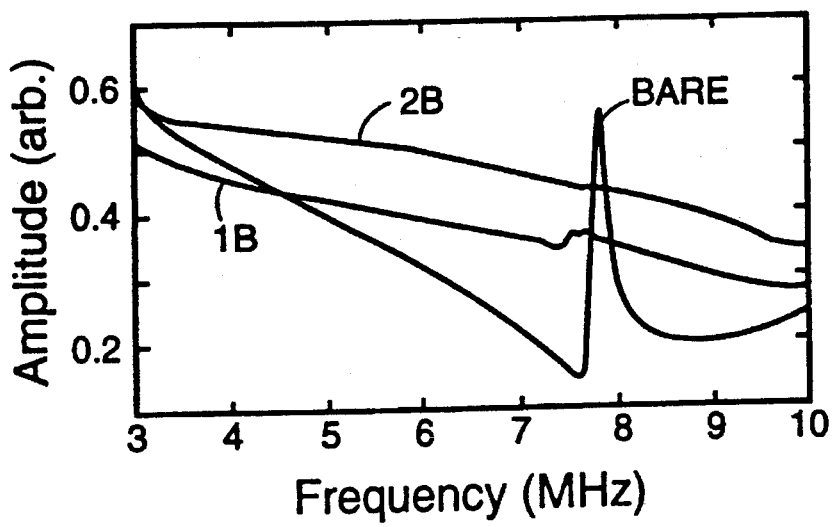

FIGS. 3A–3C graphically depict the resonant response of two transducers 1B and 2B having the geometry shown in FIG. 1B, where transducer 1B has a diameter of 0.375 inches (9.525 mm) and transducer 2B has a diameter of 0.125 inches (3.175 mm). The ceramic backing was $Al_2O_3$ of the same diameter and 0.125 inches (3.175 mm) thick. In all cases, the silver layers were deposited by conventional physical vapor deposition to a thickness of approximately 0.00025 inches (0.00635 mm) on all surfaces of the backing and one surface of the crystal.

The resonant response characteristics of the 1B and 2B transducers and the "bare" transducer, i.e., an unbacked piezoelectric crystal are shown in FIGS. 3A–3C covering frequency response ranges of 0–600 kHz (FIG. 3A), 500–3000 kHz (FIG. 3B), and 3–10 MHz (FIG. 3C). In all cases, the amplitude response is in arbitrary units and the relative position of the curves is of no significance. It can be seen that the bare transducer exhibits fundamental and harmonic resonances over the entire response spectrum. The transducer resonances can greatly obscure the response characteristics of the workpiece. In contrast, the responses of transducers 1B and 2B are essentially linear over the entire response range. The workpiece responses can be readily determined over the transducer response.

Figure 4:
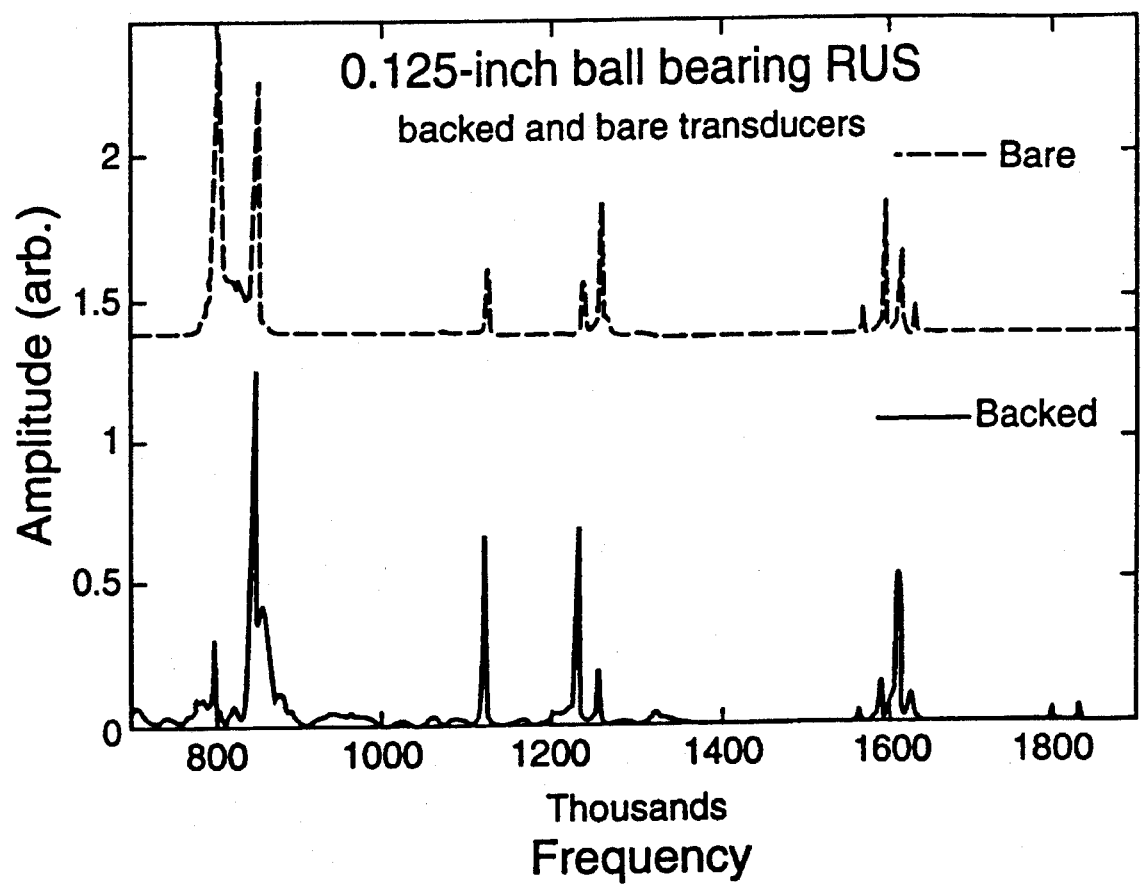
FIG. 4 graphically depicts the RUS from a ball bearing obtained with a bare transducer and a linearly responsive transducer according to the present invention.

To illustrate the advantages of the bonded transducers over a conventional bare transducer, a bonded transducer and a bare transducer having response characteristics as shown in FIGS. 3A through 3C were used to determine the resonant ultrasound spectra from a 0.125 inch diameter steel ball bearing. The resulting spectra are shown in FIG. 4. All ten lines in the backed spectrum can be related to the spectral lines expected from a sphere. There are only nine lines in the spectrum from the bare transducer and only eight of these relate to the expected lines from the ball bearing.

Figure 5:
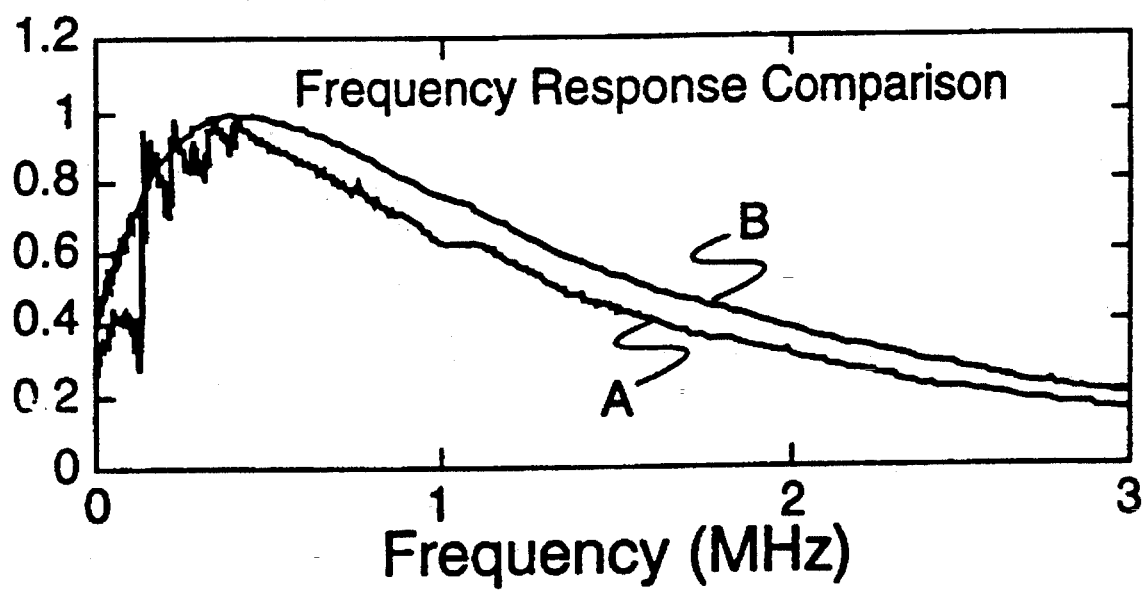
FIG. 5 graphically compares the response of a commercially available transducer A with adhesive bonding and a transducer formed with diffusion bonding B in accordance with the present invention.

In conventional transducers, the component layers are adhesively bonded together. The compliant coupling of the adhesive material is illustrated in FIG. 5. Curve A is the response of a commercial transducer with the component layers adhesively joined. Curve B is the response of a bonded transducer according to the present invention. The commercial transducer exhibits numerous resonant responses in the range of 0–3 MHz, while the bonded transducer is free of resonant responses.

The foregoing description of the invention has been presented for purposes of illustration and description and is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for fabricating an ultrasonic transducer, including the steps of:

depositing over at least one surface of a piezoelectric crystal a first film of silver to a thickness effective for diffusion bonding and less than about 0.012 mm;

depositing over at least one surface of a ceramic backing a second film of silver to a thickness effective for diffusion bonding and less than about 0.012 mm; and solid state metal diffusion bonding together said first and second films of silver.

2. A method for fabricating an ultrasonic transducer according to claim 1, further including the step of coating said at least one surface of said piezoelectric crystal and said at least one surface of said ceramic backing with first and second films of hafnium, respectively, before said disposition of said first and second films of silver.

3. A method for fabricating an ultrasonic transducer, consisting essentially of the steps of:

depositing over at least one surface of a piezoelectric crystal a first film of silver to a thickness effective for diffusion bonding and less than about 0.012 mm;

depositing over at least one surface of a ceramic backing a second film of silver to a thickness effective for diffusion bonding and less than about 0.012 mm; and solid state metal diffusion bonding together said first and second films of silver.

4. A method for fabricating an ultrasonic transducer according to claim 3, further including the step of coating said at least one surface of said piezoelectric crystal and said at least one surface of said ceramic backing with first and second films of hafnium, respectively, before said disposition of said first and second films of silver.

* * * * *